United States Patent
Chin et al.

(10) Patent No.: US 11,436,992 B2
(45) Date of Patent: Sep. 6, 2022

(54) DISPLAY SYSTEM AND METHOD FOR FORMING AN OUTPUT BUFFER OF A SOURCE DRIVER

(71) Applicant: Vanguard International Semiconductor Corporation, Hsinchu (TW)

(72) Inventors: Yu-Lung Chin, Tainan (TW); Ching-Yi Hsu, Hsinchu (TW); Chang-He Liu, Shetou Township, Changhua County (TW); Chih-Cherng Liao, Jhudong Township, Hsinchu County (TW); Jun-Wei Chen, Hsinchu (TW); Leuh Fang, Baoshan Township, Hsinchu County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 273 days.

(21) Appl. No.: 16/680,843

(22) Filed: Nov. 12, 2019

(65) Prior Publication Data
US 2020/0082780 A1   Mar. 12, 2020

Related U.S. Application Data

(62) Division of application No. 15/648,970, filed on Jul. 13, 2017, now abandoned.

(51) Int. Cl.
*H01L 27/12* (2006.01)
*H01L 29/78* (2006.01)
(Continued)

(52) U.S. Cl.
CPC ......... *G09G 3/3688* (2013.01); *G09G 3/3611* (2013.01); *G09G 3/3648* (2013.01);
(Continued)

(58) Field of Classification Search
CPC ............. H01L 29/1041; H01L 29/1045; H01L 29/105; H01L 29/66492; H01L 29/66537
See application file for complete search history.

(56) References Cited

U.S. PATENT DOCUMENTS 6,154,058 A   11/2000 Sawai
6,278,164 B1 * 8/2001 Hieda ............... H01L 29/66545
257/295
(Continued)

FOREIGN PATENT DOCUMENTS

CN   101763831 A   6/2010
TW   200518456 A   6/2005
(Continued)

OTHER PUBLICATIONS

"An-20 An Applications Guide for Op Amps", May 2013, Texas Instruments (Year: 2013).
(Continued)

*Primary Examiner* — Brigitte A Paterson
(74) *Attorney, Agent, or Firm* — Birch Stewart Kolasch & Birch, LLP

(57) ABSTRACT

A display system and a method for forming an output buffer of a source driver are provided. The display system includes a plurality of pixels coupled to a plurality of gate lines and a plurality of source lines. A gate driver provides a plurality of gate signals to the plurality of gate lines. A source driver provides a plurality of image signals to the plurality of source lines. The source driver includes an output buffer. The output buffer includes a transistor. The transistor is either a native transistor device, a depletion-mode transistor device or a low-threshold transistor device.

7 Claims, 11 Drawing Sheets

(51) Int. Cl.
H01L 29/10 (2006.01)
G09G 3/36 (2006.01)
G11C 19/00 (2006.01)
H03K 19/0175 (2006.01)
H01L 29/66 (2006.01)
H01L 29/06 (2006.01)

(52) U.S. Cl.
CPC ........... *G09G 3/3677* (2013.01); *G11C 19/00* (2013.01); *H01L 27/1255* (2013.01); *H01L 29/0653* (2013.01); *H01L 29/105* (2013.01); *H01L 29/66537* (2013.01); *H01L 29/7816* (2013.01); *H01L 29/7836* (2013.01); *H01L 29/7838* (2013.01); *H03K 19/017509* (2013.01); *G09G 2310/0267* (2013.01); *G09G 2310/0286* (2013.01); *G09G 2310/0289* (2013.01); *G09G 2310/0291* (2013.01); *G09G 2310/08* (2013.01); *H01L 29/1087* (2013.01)

(56) References Cited

U.S. PATENT DOCUMENTS

| | | | |
|---|---|---|---|
| 9,293,525 B2* | 3/2016 | Jonishi | H01L 29/063 |
| 9,997,253 B1* | 6/2018 | Chen | H01L 27/11568 |
| 2001/0009292 A1* | 7/2001 | Nishinohara | H01L 29/66545 |
| | | | 257/E29.055 |
| 2004/0005752 A1* | 1/2004 | Helm | H01L 21/823892 |
| | | | 257/E21.644 |
| 2004/0017344 A1 | 1/2004 | Takemoto | |
| 2004/0125067 A1 | 7/2004 | Kim et al. | |
| 2005/0275449 A1* | 12/2005 | Chen | H03H 7/25 |
| | | | 327/530 |
| 2007/0200160 A1* | 8/2007 | Jung | H01L 29/105 |
| | | | 257/E21.639 |
| 2008/0073666 A1 | 3/2008 | Kao | |
| 2010/0045588 A1 | 2/2010 | Lee et al. | |
| 2010/0148851 A1 | 6/2010 | Holzmann | |
| 2012/0135158 A1* | 5/2012 | Freer | H01L 21/67703 |
| | | | 427/532 |
| 2016/0204023 A1* | 7/2016 | Imaoka | H01L 21/187 |
| | | | 438/455 |
| 2017/0084711 A1* | 3/2017 | Lim | H01L 29/66818 |
| 2017/0170311 A1* | 6/2017 | Huo | H01L 29/66681 |
| 2017/0373091 A1* | 12/2017 | Lim | H01L 29/78621 |
| 2019/0035935 A1* | 1/2019 | Nakazawa | H01L 21/76856 |

FOREIGN PATENT DOCUMENTS

| | | |
|---|---|---|
| TW | 200807713 A | 2/2008 |
| TW | 201133459 A1 | 10/2011 |
| TW | 201314666 A1 | 4/2013 |
| TW | 201610953 A | 3/2016 |

OTHER PUBLICATIONS

Taiwanese Office Action and Search Report for Taiwanese Application No. 106112734, dated Jan. 9, 2018.
Taiwanese Office Action and Search Report, dated Apr. 17, 2018, for Taiwanese Application No. 106112734.

* cited by examiner

DISPLAY SYSTEM AND METHOD FOR FORMING AN OUTPUT BUFFER OF A SOURCE DRIVER

CROSS-REFERENCE TO RELATED APPLICATIONS

This application is a Divisional of copending application Ser. No. 15/648,970, filed on Jul. 13, 2017, which is hereby expressly incorporated by reference into the present application.

BACKGROUND OF THE INVENTION

Field of the Invention

The present invention relates to a display system, and in particular to a source driver configuration used in a display system.

Description of the Related Art

Display panel technology plays an important role in the consumer electronics and entertainment industries. A conventional display panel, such as a liquid-crystal display (LCD) for example, displays an image by changing the tilt direction of the liquid-crystal (LC) molecules through the output voltage of the driver chip module. Therefore, the transmittance of each of the pixels is changed accordingly to construct the display image. The driver chip mainly includes a source driver and a gate driver. When a predetermined color is displayed in the pixel, a gate driver is required to control a thin film transistor (TFT), which acts as a switch, and a source driver is required to input the signals (R, G, B) of the three primary colors. The gate driver is responsible for the switching operation of each pixel row in the display panel. When the display is scanned row by row, the gate driver turns on the switches in the corresponding row, thereby allowing the signal to be input by the source driver. The source driver is responsible for outputting the signal to the corresponding pixel column in the display panel. When the gate driver turns on the switches in a predetermined row, the source driver inputs the data voltage to the corresponding row and provides the desired data for the displayed image. When the resolution, brightness and response speed of the display are gradually improved, the driver chip is required to be operated in high-frequency and high-voltage conditions to satisfy the requirements of a high scanning frequency and a fast response time.

Therefore, a circuit configuration for a source driver is needed in order to improve the display quality and the response time of the display panel.

BRIEF SUMMARY OF THE INVENTION

Exemplary embodiments of a display system and a method for forming an output buffer of a source driver are provided. An exemplary embodiment of a display system includes a plurality of pixels coupled to a plurality of gate lines and a plurality of source lines. A gate driver is configured to provide a plurality of gate signals to the plurality of gate lines. A source driver is configured to provide a plurality of image signals to the plurality of source lines. The source driver includes an output buffer. The output buffer is either a native transistor device, a depletion-mode transistor device or a low-threshold transistor device.

Another exemplary embodiment of a display system includes a plurality of pixels coupled to a plurality of gate lines and a plurality of source lines. A gate driver is configured to provide a plurality of gate signals to the plurality of gate lines. A source driver is configured to provide a plurality of image signals to the plurality of source lines. The source driver includes an output buffer. The threshold voltage (Vt) of the transistor device is equal to or less than about 0.5 volts (V) or equal to or less than about 0 volts (V).

An exemplary embodiment of a method for forming an output buffer of a source driver providing a P-type substrate. A high-voltage P-type well doped region is formed in the P-type substrate and two High-voltage N-type well doped regions on opposite sides of the high-voltage P-type well doped region A gate structure is formed on the P-type substrate. The gate structure covers the entirely P-type high-voltage well doped region, and a portion of the High-voltage N-type well doped regions. A first threshold voltage adjusting implantation process is performed on a portion of the high-voltage P-type well doped region close to a surface of the P-type substrate. A first threshold voltage adjusting implantation process is performed on the portion of the high-voltage P-type well doped region close to the surface of the P-type substrate, so that the threshold voltage (Vt) of the output buffer is equal to or less than about 0.5 volts (V).

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
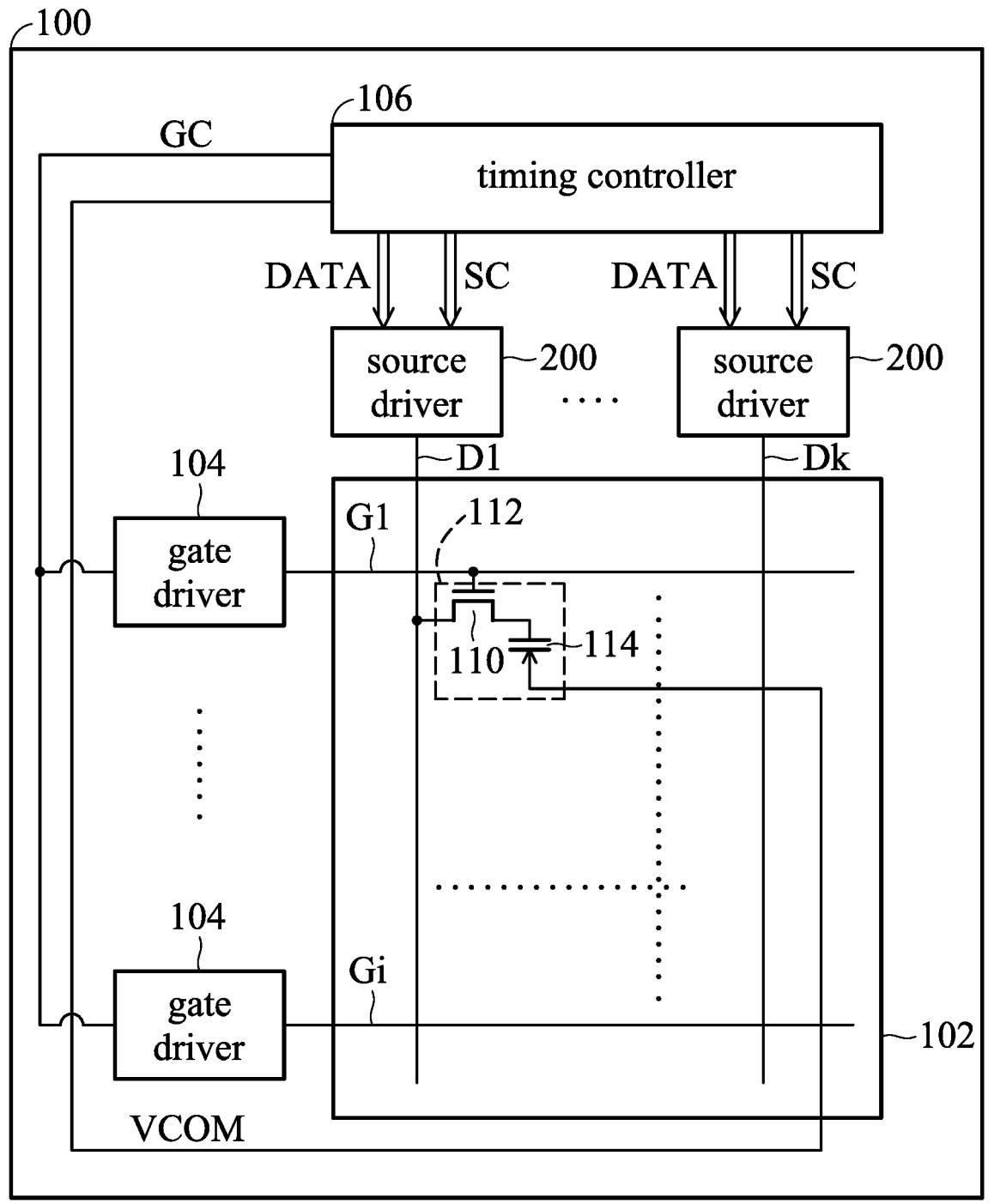
FIG. 1 is a block diagram of a display system, in accordance with some embodiments.

FIG. 1 is a block diagram of a display system 100 in accordance with some embodiments. As shown in FIG. 1, in some embodiments, the display system 100 includes a liquid-crystal display (LCD) device. The liquid-crystal display (LCD) device includes a liquid-crystal display panel (LCD panel) 102, a plurality of gate drivers 104, a plurality of source driver 200 and a timing controller 106.

In some embodiments, the LCD panel 102 may include a thin film transistor substrate (TFT substrate), a color filter substrate (not shown) and a liquid-crystal (LC) layer (not shown). The thin film transistor substrate may have a thin film transistor (TFT) array disposed therein. In addition, the color filter substrate is disposed facing the thin film transistor substrate. Moreover, the liquid-crystal (LC) layer may be disposed between the thin film transistor substrate and the color filter substrate. For the convenience of illustration, the position of the thin film transistor substrate may be the same as that of the liquid-crystal display panel 102 in FIG. 1.

In some embodiments, the thin film transistor substrate of the liquid-crystal display panel 102 may include a plurality of gate lines G1-Gi and a plurality of source lines (data lines) D1-Dk. The gate lines G1-Gi and the source lines D1-Dk intersect each other and define a plurality of pixels 112. Therefore, the pixels 112 are electrically coupled to the corresponding gate lines G1-Gi and the corresponding source lines D1-Dk. Each of the pixels 112 has a thin film transistor (TFT) 110 and a storage capacitor 114. The gate lines G1-Gi are respectively electrically coupled to gates of the thin film transistors 110 in the corresponding pixels 112. In addition, the source lines D1-Dk are respectively electrically coupled to sources of the thin film transistor 110 in the corresponding pixels 112. Each of the storage capacitors 114 of the pixels 112 is electrically coupled to drains of the thin film transistors 110 in the corresponding pixels 112. In the same pixels 112, the storage capacitor 114 is electrically coupled to a drain of the thin film transistor 110 in some embodiments shown in FIG. 1.

In some embodiments, the gate drivers 104 of the display system 100 are respectively electrically coupled to the corresponding gate lines G1-Gi. The gate drivers 104 are configured to turn-on the gate lines G1-Gi of the liquid-crystal display panel 102 in sequence. The source drivers 200 of the display system 100 are respectively electrically coupled to the corresponding source lines D1-Dk. In addition, the source drivers 200 are configured to apply analog signals to the source lines D1-Dk of the liquid-crystal display panel 102. The timing controller 106 of the display system 100 is electrically coupled to the gate drivers 104 and the source drivers 200. In addition, the timing controller 106 of the display system 100 is configured to control the operation sequence of the source drivers 110 and the gate drivers 130 and to provide the required image signals to the liquid-crystal display panel 102. Moreover, the timing controller 106 of the display system 100 is configured to provide the desired voltage to the storage capacitors 114 of the liquid-crystal display panel 102.

The timing controller 106 may be configured to receive an image signal and a control signal from an external device. The control signal may include the horizontal synchronization signals (HSYNC), the vertical synchronization signals (VSYNC), the main clock signals and the data enable signals. In addition, the timing controller 106 may process the image signal according the operation conditions of the liquid-crystal display panel 102 to provide a digital image signal string DATA and a source control signal string SC transmitted to the source driver 200 and a gate control signal string GC transmitted to the gate drivers 104. In some embodiments, the source control signal string SC includes an output control signal and a clock signal. The output control signal is used to represent the analog signal being applied to the corresponding source line. In some embodiments, the gate control signal string GC may include a vertical start signal, a gate clock signal and an output enable signal. The vertical start signal is used for the start of providing the turn-on voltage of the gates (of the thin film transistors 110) of the pixels 112. The output enable signal is used to control the retention time of the turn-on voltage of the gates (of the thin film transistors 110) of the pixels 112. In some embodiments, the timing controller 106 provides a common voltage VCOM to the storage capacitors 114 of the liquid-crystal display panel 102.

Each of the gate drivers 104 is configured to receive and process the gate control signal string GC form the timing controller 106 and is configured to provide a plurality of gate signals to the gate lines G1-Gi. The source driver 200 is configured to receive and process the digital image signal string DATA and the source control signal string SC from the timing controller 106 and provide a plurality of image signals to the source lines D1-Dk.

Figure 2:
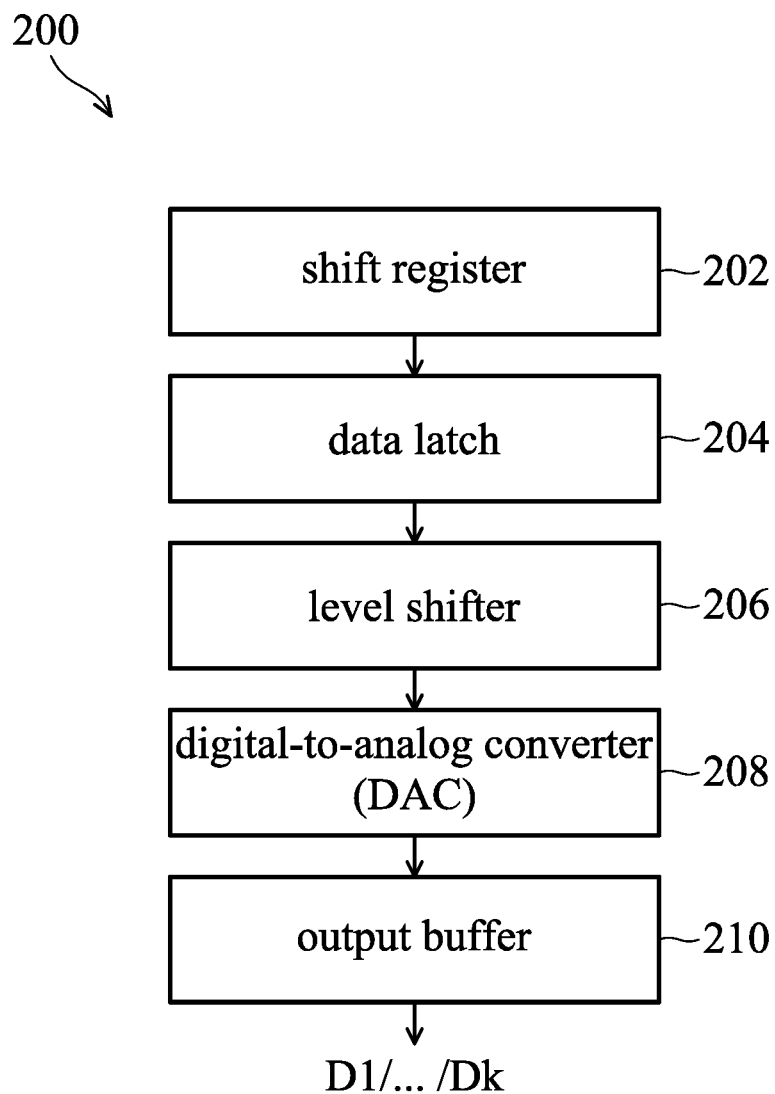
FIG. 2 is a block diagram of a source driver in accordance with some embodiments.

FIG. 2 is a block diagram of the source driver 200 in accordance with some embodiments. In some embodiments, the source driver 200 may include a shift register 202, a data latch 204, a level shifter 206, a digital-to-analog converter (DAC) 208 and an output buffer 210. In some embodiments, the shift register 202 and the data latch 204 are configured to receive the digital data (signal). In addition, the digital-to-analog converter (DAC) 208 and the output buffer 210 are configured to output the analog signal.

In some embodiments, the shift register 202 of the source driver 200 receives and processes the digital image signal string DATA applied from the external device (e.g. the timing controller 106) and is configured to provide a plurality of shift signals. More specifically, the shift register 202 is configured to respond to the source control signal string SC, for example, the clock signals or horizontal start signals, and control the received digital image signal string DATA. Therefore, the shift register 202 may output (provide) a plurality of shift signals and store the shift signals in the data latch 204 in sequence.

In some embodiments, the data latch 204 of the source driver 200 receives and processes the plurality of shift signals and is configured to provide a plurality of latched signals. More specifically, the data latch 204 is configured to receive and store the series of image signals DATA by responding with the shift signals. In addition, the data latch 204 is configured to output a plurality of latched signals by responding with the source control signal string SC for example, the clock signals.

In some embodiments, the level shifter 206 of the source driver 200 receives and processes the plurality of latched signals and is configured to provide a plurality of converted signals. More specifically, the level shifter 206 is configured to convert the latched signals output by the data latch 204 from a low-voltage range into a high-voltage range. Therefore, the level shifter 206 is configured to output the converted signals in the high-voltage range.

In some embodiments, the digital-to-analog converter (DAC) 208 of the source driver 200 receives and processes the plurality of converted signals and is configured to provide a plurality of analog signals. More specifically, the digital-to-analog converter (DAC) 208 is configured to receive and convert the converted signals in the high-voltage range output by the level shifter 206 into analog signals, which are configured to drive the corresponding source lines.

In some embodiments, the output buffer 210 of the source driver 200 receives and processes the plurality of analog signals and is configured to provide a plurality of image signals to the corresponding source lines D1-Dk (shown in FIG. 1). The output buffer 210 may be configured to isolate the signal input terminal form the signal output terminal, thereby preventing the signal input terminal form the loading effect. In addition, the output buffer 210 may be configured to provide enough driving ability to be able to endure the loading of the corresponding source lines (data lines) and output the analog image signals conforming to the specification of the display system.

Figure 3:
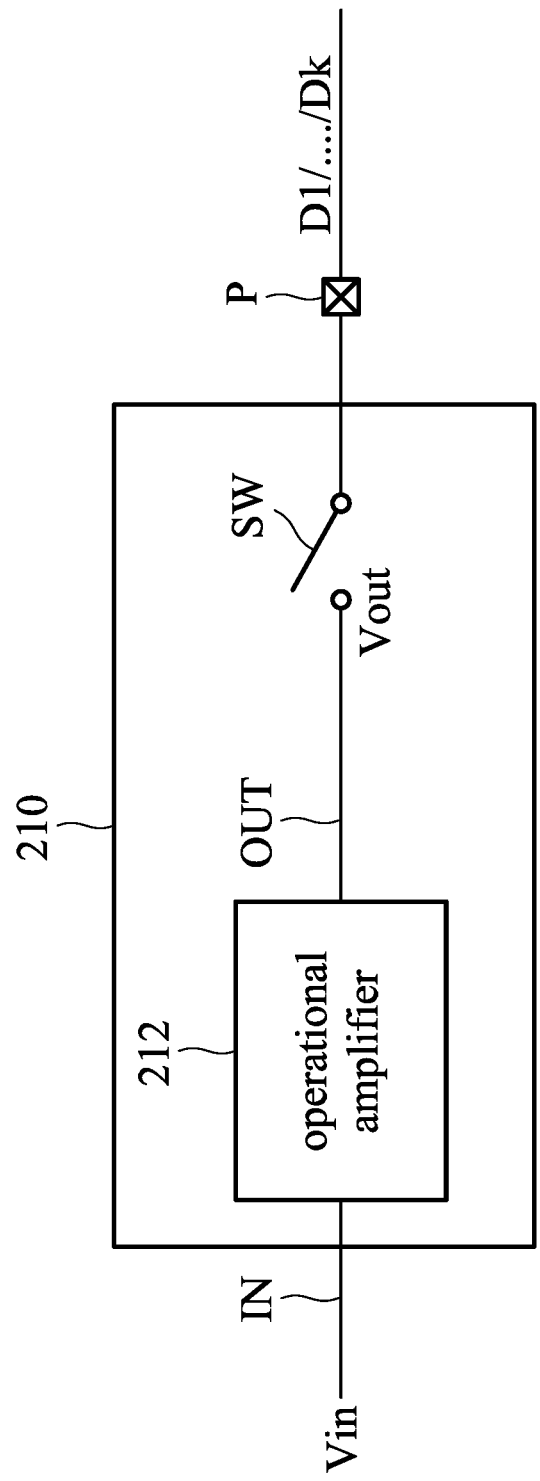
FIG. 3 is an equivalent circuit diagram of an output buffer in accordance with some embodiments.

FIG. 3 is an equivalent circuit diagram of the output buffer 210 in accordance with some other embodiments. In addition, FIG. 3 is an equivalent circuit diagram of the output buffer 210 corresponds to each of the source lines (e.g. the source lines D1-Dk in FIG. 1). In some embodiments, the output buffer 210 may include an operational amplifier 212, a switch SW and an output pad P. The operational amplifier 212 includes an input terminal IN and an output terminal OUT. As shown in FIG. 3, the input terminal IN of the operational amplifier 212 is configured to receive the analog signal Vin. The switch SW of the output buffer 210 is electrically connected to the output terminal OUT and the output pad P of the operational amplifier 212. The switch SW of the output buffer 210 may serve as an electrical transmitting path of the corresponding source line, which is electrically connected to of the output pad P. The operational amplifier 212 may provide the output voltage Vout having a corresponding voltage level to the output terminal OUT according to the analog signal Vin received from the input terminal IN. When the switch SW is turned on, the output terminal OUT of the operational amplifier 212 may be electrically connected to the source lines (e.g. one of the source lines D1-Dk) of the output pad P of the source driver 200 to drive the voltage of the source lines to a predetermined voltage level.

In some embodiments, the switch SW of the output buffer 210 includes a transistor device. In addition, the transistor device may be either a native transistor device, a depletion-mode transistor device or a low-threshold transistor device. In some embodiments, when the transistor device is a low-threshold transistor device, the threshold voltage (Vt) of the transistor device may be equal to or less than about 0.5 volts (V). In some embodiments, when the transistor device is a native transistor device or a depletion-mode transistor device, the threshold voltage (Vt) of the transistor device may be equal to or less than about 0 volts (V).

FIGS. 4A-4D are schematic cross-sectional views of transistor devices 500a-500d of the output buffer in accordance with some embodiments. In some embodiments, the transistor device of the output buffer may include an N-type metal-oxide-semiconductor field effect transistor (NMOS) or a P-type metal-oxide-semiconductor field effect transistor (PMOS). In some embodiments, the transistor device of the output buffer may include a lateral diffused metal-oxide-semiconductor field effect transistor (LDMOS) or a double diffused drain metal-oxide-semiconductor field effect transistor (DDDMOS).

Figure 4A:
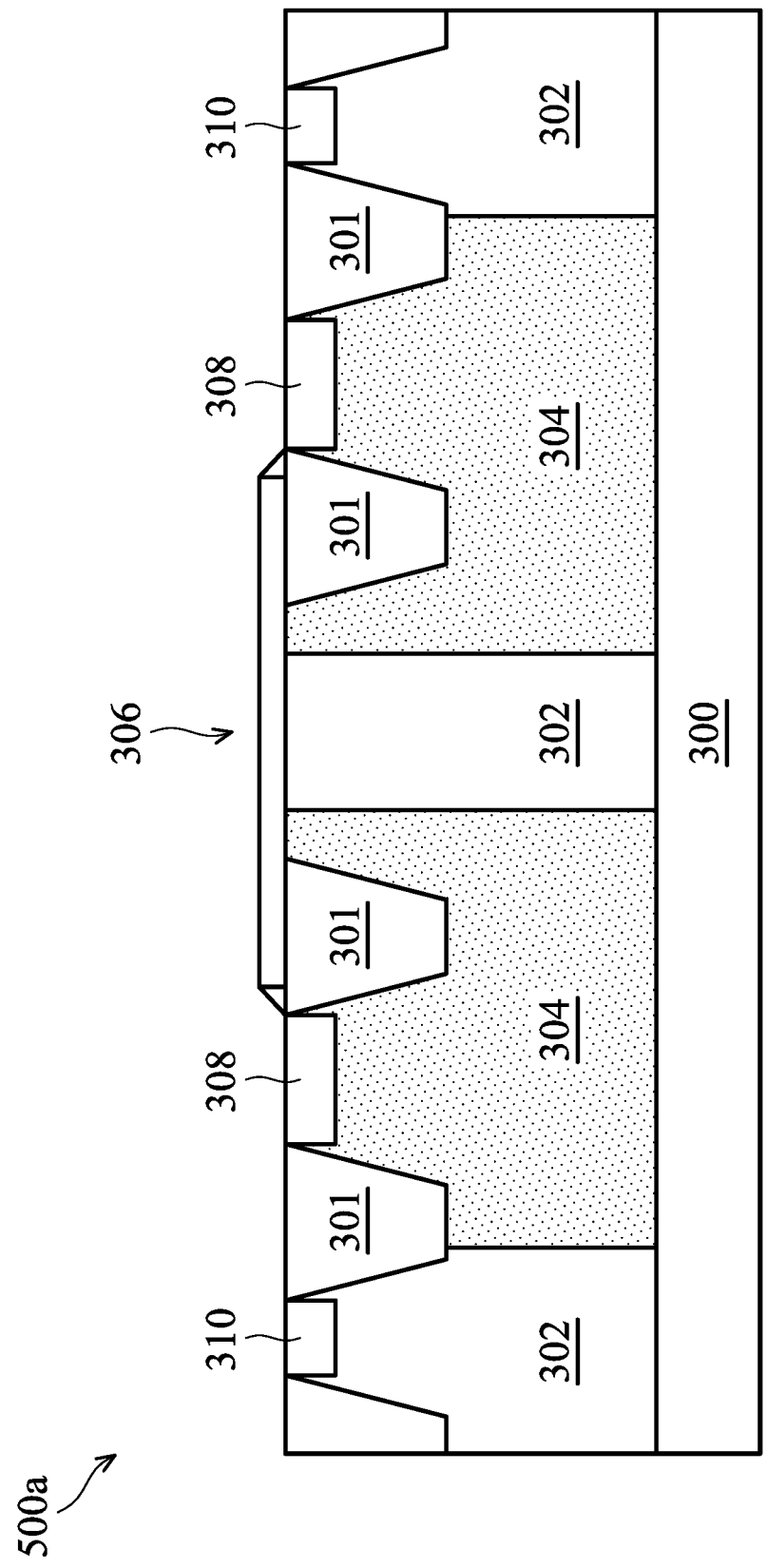
FIGS. 4A-4D are schematic cross-sectional views of a transistor device of an output buffer in accordance with some embodiments.

As shown in FIG. 4A, in some embodiments, the transistor device 500a may be an N-type lateral diffused metal-oxide-semiconductor field effect transistor (also referred to as LDNMOS). Therefore, the transistor device 500a is also referred to a LDNMOS 500a. The LDNMOS 500a may include a P-type substrate 300, high-voltage P-type well (HVPW) doped regions 302, high-voltage N-type well (HVNW) doped regions 304, a gate structure 306, N-type heavily doped regions (N+ doped regions) 308 and P-type heavily doped regions (P+ doped regions) 310. In some embodiments, the P-type substrate 300 may be a P-type epitaxial substrate, for example. A plurality of HVPW doped regions 302 and a plurality of HVNW doped regions 304 are alternately arranged on the P-type substrate 300. Therefore, two opposite sides of each of the HVPW doped regions 302 are adjacent to different HVNW doped regions 304. In addition, the two opposite sides each of the HVNW doped regions 304 are adjacent to different HVPW doped regions 302.

As shown in FIG. 4A, the LDNMOS 500a may include one or more than one isolation features 301 formed extending form a top surface of the P-type substrate 300 to a portion of the P-type substrate 300 to define positions of the N-type heavily doped region (N+) 308 and the P-type heavily doped region (P+) 310. The isolation features 301 may be shallow trench isolation (STI) features or local oxidation of silicon (LOCOS) features, for example.

As shown in FIG. 4A, the gate structure 306 of the LDNMOS 500a is disposed on the surface of the P-type substrate 300. The gate structure 306 of the LDNMOS 500a may fully cover one of the HVPW doped regions 302 and partially cover two HVNW well doped regions 304 adjacent to the two opposite sides of the HVPW doped region 302. In addition, the gate structure 306 may fully cover isolation features 301 in the HVNW well doped regions 304. A portion of the HVPW doped region 302, which is fully covered by the gate structure 306 and close to the gate structure 306, may serve as a channel region of the LDNMOS 500a. In addition, the two HVNW well doped regions 304 adjacent to the two opposite sides of the HVPW doped region 302 may serve as source/drain regions (S/D regions) of the LDNMOS 500a.

As shown in FIG. 4A, the plurality of N+ doped regions 308 of the LDNMOS 500a are respectively disposed on the HVNW doped regions 304. In addition, the plurality of P+ doped regions 310 of the LDNMOS 500a are respectively disposed on the HVPW doped regions 302. In addition, the N+ doped regions 308 and the P+ doped regions 310 are respectively surrounded by the isolation features 301. The N+ doped regions 308 of the LDNMOS 500a may serve as source/drain (S/D) pick-up doped regions. The P+ doped regions 310 of the LDNMOS 500a may serve as bulk pick-up doped regions.

Figure 4B:
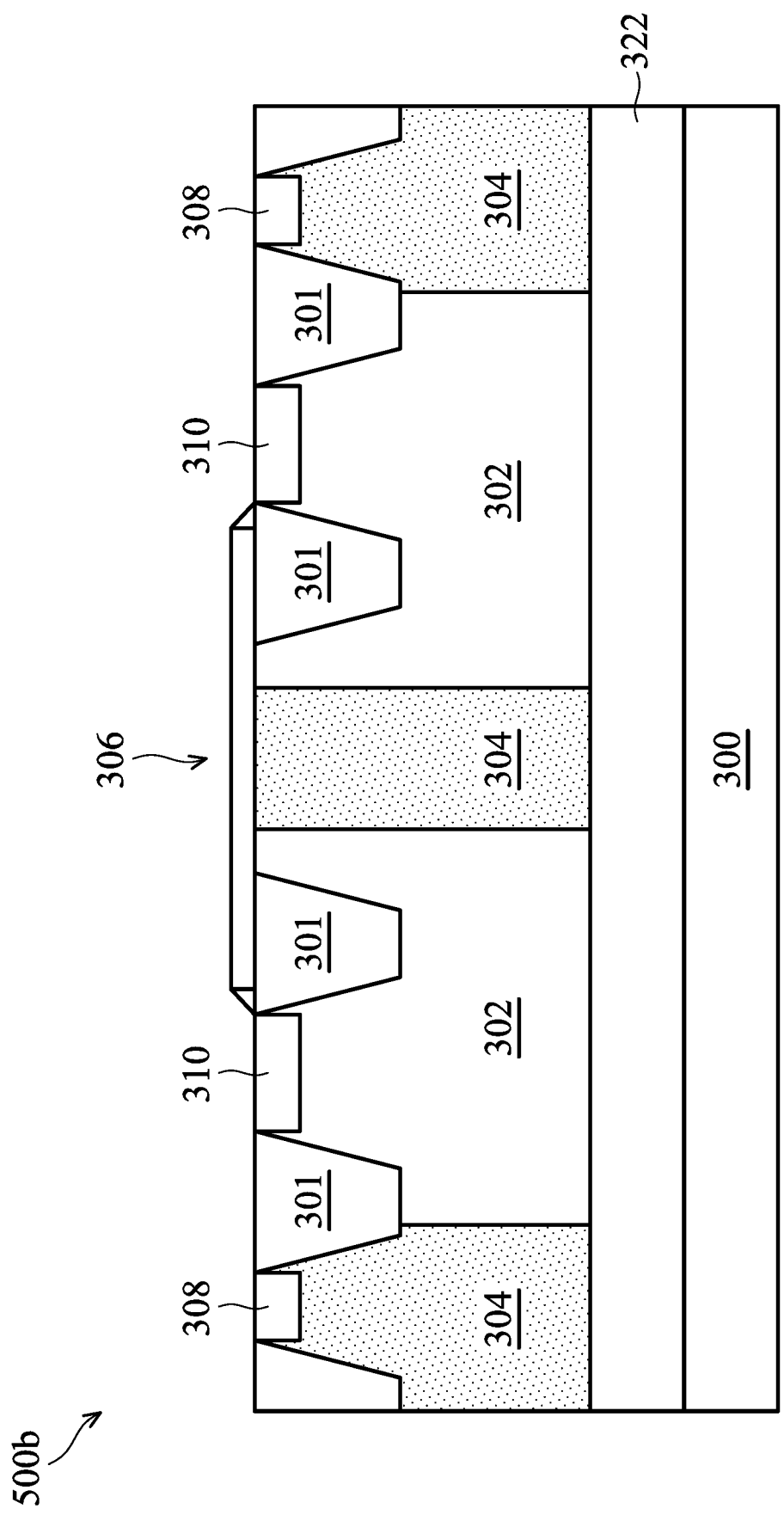

As shown in FIG. 4B, in some embodiments, the transistor device 500b is a P-type lateral diffused metal-oxide-semiconductor field effect transistor (also referred to as LDPMOS). Therefore, the switch device 500b may be also referred to as LDPMOS 500b. The LDPMOS 500b may include a P-type substrate 300, a deep N-type well (DNW) doped region 322, HVPW well doped regions 302, HVNW well doped regions 304, a gate structure 306, N+ doped regions 308 and P+ doped regions 310. Hereinafter, elements of the embodiments that are the same or similar as those previously described with reference to FIG. 4A will not be repeated, for brevity.

As shown in FIG. 4B, the DNW doped region 312 of the LDPMOS 500b is disposed on the P-type substrate 300. The HVPW doped regions 302 and the HVNW doped regions 304 of the LDPMOS 500b are alternately arranged on the DNW doped region 312.

The gate structure 306 of the LDPMOS 500b may fully cover one of the HVNW well doped regions 304 and partially cover two HVPW doped regions 302 adjacent to two opposite sides of the HVNW well doped region 304. In addition, the gate structure 306 may fully cover isolation features 301 in the HVPW doped regions 302. A portion of the HVNW well doped region 304, which is fully covered by the gate structure 306 and close to the gate structure 306, may serve as a channel region of the LDPMOS 500b. In addition, the two HVPW doped regions 302 adjacent to two opposite sides of the HVNW well doped region 304 may serve as source/drain regions (S/D regions) of the LDPMOS 500b.

As shown in FIG. 4B, the plurality of N+ doped regions 308 of the LDPMOS 500b are respectively disposed on the HVNW doped regions 304. In addition, the plurality of P+ doped regions 310 of the LDPMOS 500b are respectively disposed on the HVPW doped regions 302. In addition, the N+ doped regions 308 and the P+ doped regions 310 are respectively surrounded by the isolation features 301. The P+ doped regions 310 of the LDPMOS 500b may serve as source/drain (S/D) pick-up doped regions. The N+ doped regions 308 of the LDPMOS 500b may serve as bulk pick-up doped regions.

Figure 4C:
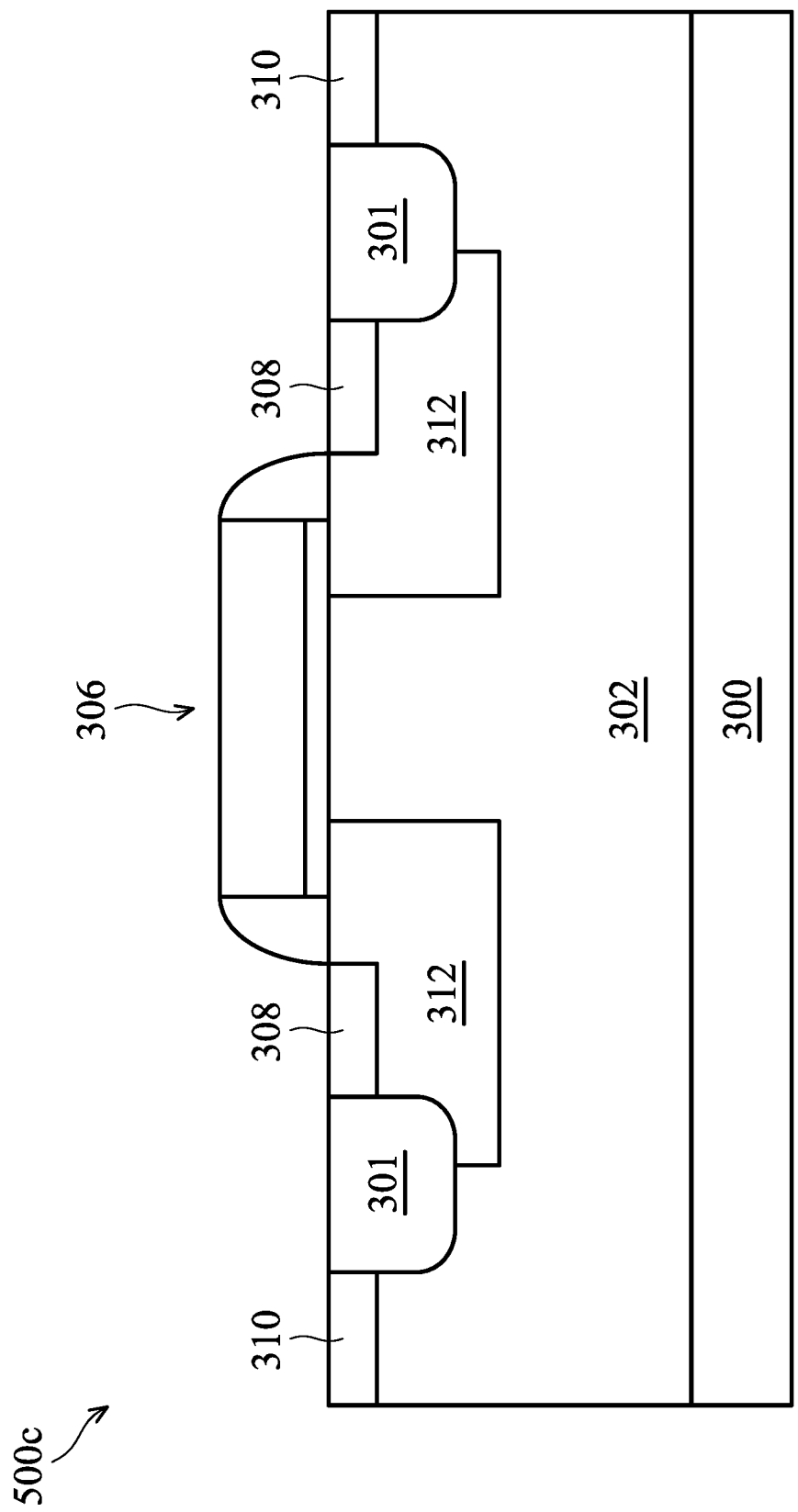

The transistor device 500c shown in FIG. 4C may be an N-type double diffused drain metal-oxide-semiconductor field effect transistor (also referred to as DDDNMOS). Elements of the embodiments that are the same or similar as those previously described with reference to FIGS. 4A-4B, are hereinafter not repeated for brevity.

As shown in FIG. 4C, the DDDNMOS 500c may include a P-type substrate 300, a HVPW doped region 302, High-voltage N-type diffused drain (HVNDD) doped regions 312, a gate structure 306, N+ doped regions 308 and P+ doped regions 310.

As shown in FIG. 4C, the HVPW doped region 302 of the DDDNMOS 500c is disposed on the P-type substrate 300. The DDDNMOS 500c may have two HVNDD doped regions 312 respectively disposed on the HVPW doped regions 302. The gate structure 306 of the DDDNMOS 500c is disposed on the HVPW doped region 302. In addition, two opposite sides of the gate structure 306 may partially overlap the two HVNDD doped regions 312, respectively. Therefore, the HVNDD doped regions 312 may serve as source/drain regions (S/D regions) of the DDDNMOS 500c. A portion of the HVPW doped regions 302, which is disposed directly under the gate structure 306 and between the HVNDD doped regions 312 and is disposed close to the gate structure 306, may serve as a channel region of the DDDNMOS 500c.

The DDDNMOS 500c may have two N+ doped regions 308 respectively disposed on the two HVNDD doped regions 312 and adjacent to the two opposite sides of the gate structure 306. Therefore, the N+ doped regions 308 may serve as source/drain (S/D) pick-up doped regions of the DDDNMOS 500c. In addition, the DDDNMOS 500c may have two P+ doped regions 310 respectively disposed on the HVPW doped regions 302 outside the two HVNDD doped regions 312. The P+ doped regions 310 of the DDDNMOS 500c are separated from the N+ doped regions 308 through the isolation features 301. Therefore, the P+ doped regions 310 may serve as bulk pick-up doped regions of the DDDNMOS 500c.

The transistor device 500d shown in FIG. 4C may be a P-type double diffused drain metal-oxide-semiconductor field effect transistor (also referred to as DDDPMOS). Elements of the embodiments that are the same or similar as those previously described with reference to FIGS. 4A-4C are hereinafter not repeated for brevity.

Figure 4D:
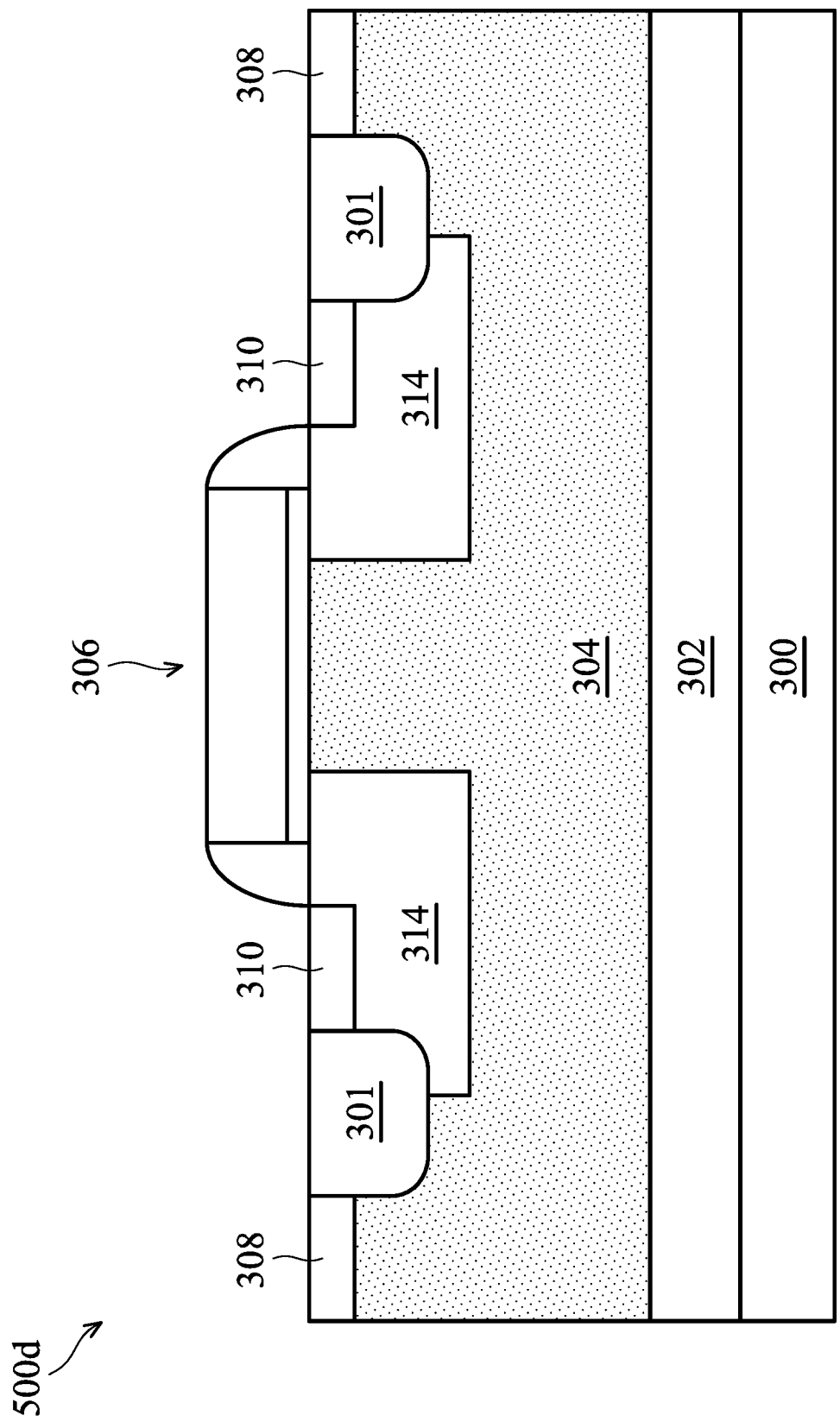

As shown in FIG. 4D, the DDDPMOS 500d may include a P-type substrate 300, a HVPW doped region 302, a HVNW doped region 304, high-voltage P-type diffused drain (HVPDD) doped regions 314, a gate structure 306, N+ doped regions 308 and P+ doped regions 310.

As shown in FIG. 4D, the HVNW doped region 304 of the DDDPMOS 500d is disposed on the P-type substrate 300. The HVNW doped region 304 is disposed on the HVPW doped region 302. The DDDPMOS 500d may have two HVPDD doped regions 314 disposed on the HVNW doped region 304. The gate structure 306 of the DDDPMOS 500d is disposed on the HVNW doped region 304. In addition, two opposite sides of the gate structure 306 may partially overlap the two HVPDD doped regions 314, respectively. Therefore, the HVPDD doped regions 314 may serve as source/drain regions (S/D regions) of the DDDPMOS 500d. A portion of the HVNW doped region 304, which is disposed directly under the gate structure 306 and between the HVPDD doped regions 314 and is disposed close to the gate structure 306, may serve as a channel region of the DDDPMOS 500d.

The two P+ doped regions 310 of the DDDPMOS 500 are respectively disposed on the HVPDD doped regions 314 and adjacent to the opposite sides of the gate structure 306. Therefore, the P+ doped regions 310 may serve as source/drain (S/D) pick-up doped regions of the DDDPMOS 500d. In addition, the two N+ doped regions 308 of the DDDPMOS 500d are disposed on the HVNW doped region 304 and outside the two HVPDD doped regions 314. The two N+ doped regions 308 of the DDDPMOS 500d are separated from the P+ doped regions 310 through the isolation features 301. Therefore, the N+ doped regions 308 may serve as bulk pick-up doped regions of the DDDPMOS 500d.

Figure 5A:
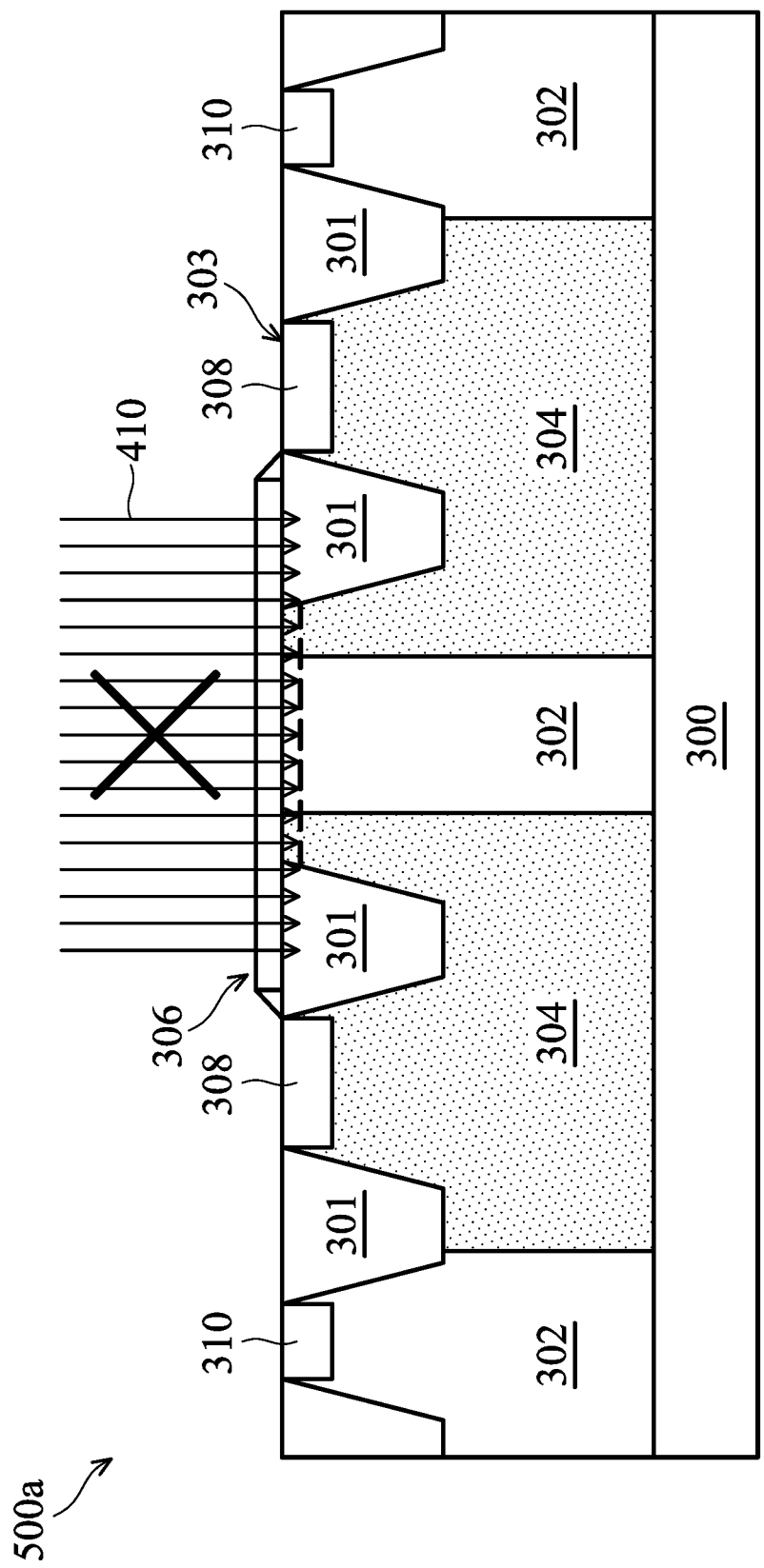
FIGS. 5A-5C are schematic cross-sectional views of a transistor device of an output buffer in accordance with some embodiments, showing various threshold voltage adjusting implantation processes performed on the transistor device of the output buffer, which is a lateral diffused metal-oxide-semiconductor field effect transistor (LDMOS)
Figure 5B:
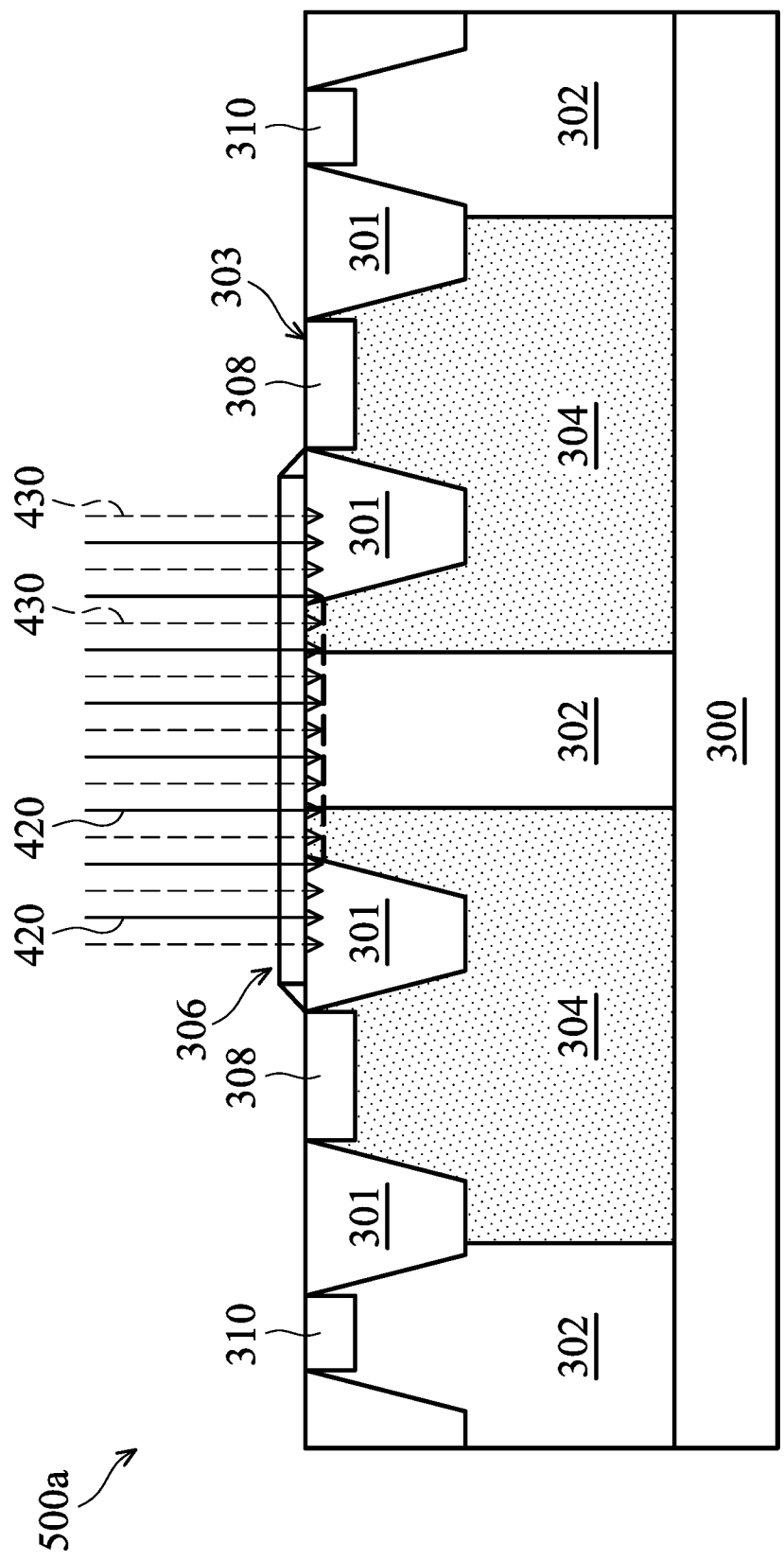
Figure 5C:
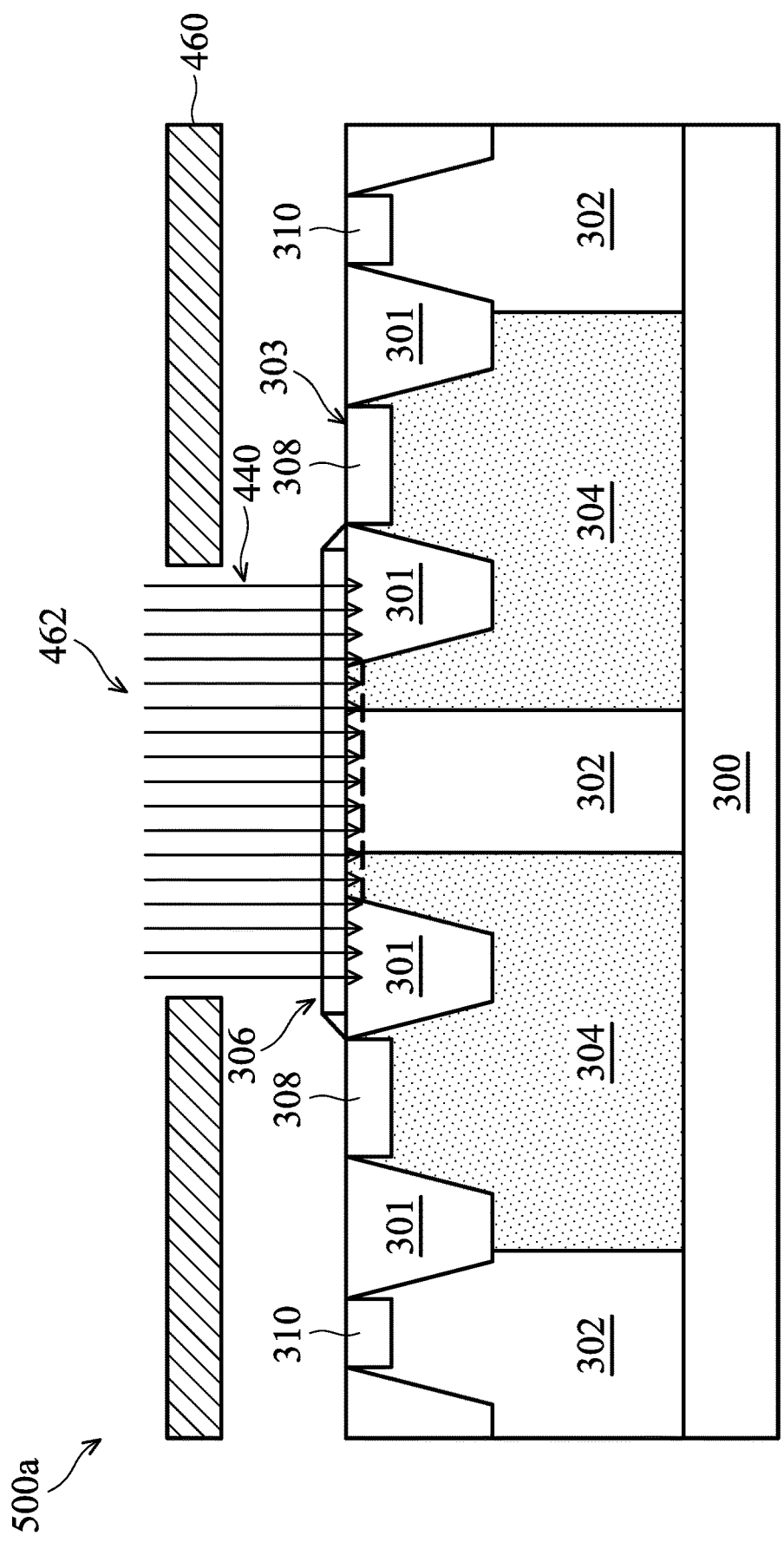

FIGS. 5A-5C are schematic cross-sectional views of a transistor device of an output buffer in accordance with some embodiments. FIGS. 5A-5C also show various threshold voltage adjusting implantation processes performed on the transistor device of the output buffer when the transistor device of the output buffer is the LDNMOS 500a.

As shown in FIG. 5A, first, a P-type substrate 300 is provided. In addition, isolation features 301 are formed on the P-type substrate 300. Next, several implantation processes are performed to form a plurality of well doped regions in the P-type substrate 300. The well doped regions may include a plurality of HVPW doped regions 302 and a plurality of HVNW doped regions 304 alternately arranged with the HVPW doped regions 302. Afterward, a gate structure 306 is formed on the P-type substrate 300. The gate structure 306 of the LDNMOS 500a may fully cover one of the HVPW doped regions 302 and may partially cover two HVNW well doped regions 304 adjacent to two opposite sides of the HVPW doped region 302. In addition, the gate structure 306 may fully cover isolation features 301 in the HVNW well doped regions 304.

Next, as shown in FIG. 5A, a HVNMOS threshold voltage (Vt) adjusting implantation process 410 may be not performed (or skipped) in order to lower the threshold voltage (Vt) of the LDNMOS 500, so that the LDNMOS 500 can be either a native transistor device, a depletion-mode transistor device or a low-threshold transistor device. The HVNMOS Vt adjusting implantation process 410 is performed on the channel region of the LDNMOS 500a (a portion of the HVPW doped region 302, which is positioned directly under the gate structure 306 and close to a surface of the P-type substrate 300).

Next, several implantation processes may be performed to form the plurality of N+ doped regions 308 on the HVNW doped region 304 and the plurality of P+ doped regions 310 on the HVPW doped region 302. After performing the aforementioned processes, the LDNMOS 500a of the output buffer of the display system in accordance with some embodiments is formed.

FIG. 5B shows the threshold voltage (Vt) adjusting implantation process performed on the transistor device (LDNMOS 500a) of the output buffer in accordance with some embodiments. Elements of the embodiments that are the same or similar as those previously described with reference to FIG. 5A, are hereinafter not repeated for brevity.

As shown in FIG. 5B, in some embodiments, after the gate structure 306 is formed, a NMOS threshold voltage (Vt) adjusting implantation process 420 and a PMOS threshold voltage (Vt) adjusting implantation process 430 are simultaneously performed on the channel region of the LDNMOS 500a (a portion of the HVPW doped region 302, which is positioned directly under the gate structure 306 and close to the surface 303 of the P-type substrate 300), so that the Vt of the LDNMOS 500a can be adjusted to be close to, equal to or less than about 0V. For example, the conductive type of the channel region of the LDNMOS 500a can be converted into N-type and the LDNMOS 500a may serve as a depletion-mode transistor device after performing the NMOS threshold voltage (Vt) adjusting implantation process 420 and the PMOS threshold voltage (Vt) adjusting implantation process 430. In some embodiments, the NMOS Vt adjusting implantation process 420 is an HVNMOS Vt adjusting implantation process. In addition, the PMOS Vt adjusting implantation process 430 is a HVPMOS Vt adjusting implantation process. In some embodiments, the dopants implanted in the channel region by the NMOS Vt adjusting implantation process 420 and by the PMOS adjusting implantation process 430 have opposite conductive types.

Several implantation processes may be performed to form the plurality of N+ doped regions 308 on the HVNW doped region 304 and the plurality of P+ doped regions 310 on the HVPW doped region 302 after performing the NMOS Vt adjusting implantation process 420 and by the PMOS adjusting implantation process 430. After performing the aforementioned processes, the LDNMOS 500a of the output buffer of the display system in accordance with some embodiments is formed.

FIG. 5C shows the threshold voltage (Vt) adjusting implantation process of the transistor device (LDNMOS 500a) of the output buffer in accordance with some embodiments. Elements of the embodiments that are the same or similar as those previously described with reference to FIG. 5A are hereinafter not repeated for brevity.

As shown in FIG. 5C, in some embodiments, an additional mask 460 is used in the process for forming the LDNMOS 500a after forming the gate structure 306 and performing the HVNMOS Vt adjusting implantation process 410. The mask 460 may have an opening 462 to expose the channel region of the LDNMOS 500a only. Therefore, another HV device Vt adjusting implantation process 440 may be performed on the channel region of the LDNMOS 500a (a portion of the HVPW doped region 302, which is positioned directly under the gate structure 306 and close to the surface 303 of the P-type substrate 300) through the mask 460. The Vt of the LDNMOS 500a can be adjusted close to, equal to or less than about 0V. In some embodiments, the HVNMOS Vt adjusting implantation process 410 and the HV device Vt adjusting implantation process 440 may implant dopants of the same conductive type or with opposite conductive types in the channel region.

Several implantation processes may be performed to form the plurality of N+ doped regions 308 on the HVNW doped region 304 and the plurality of P+ doped regions 310 on the HVPW doped region 302 after performing the HVNMOS Vt adjusting implantation process 410 and the HV device Vt adjusting implantation process 440. After performing the aforementioned processes, the LDNMOS 500a of the output buffer of the display system in accordance with some embodiments is formed.

In some other embodiments, when the transistor device of the output buffer is the LVPMOS 500b (FIG. 4B), some additional Vt adjusting implantation processes may be performed on the channel region, or the original Vt adjusting implantation processes may not be performed on the channel region, so that the Vt of the LVPMOS 500b can be adjusted to be close to, equal to or less than about 0V. For example, the conductive type of the channel region of the LVPMOS 500b can be converted into P-type and the LVPMOS 500b may serve as a depletion-mode transistor device after performing the additional Vt adjusting implantation processes or without performing the original Vt adjusting implantation processes.

Figure 6:
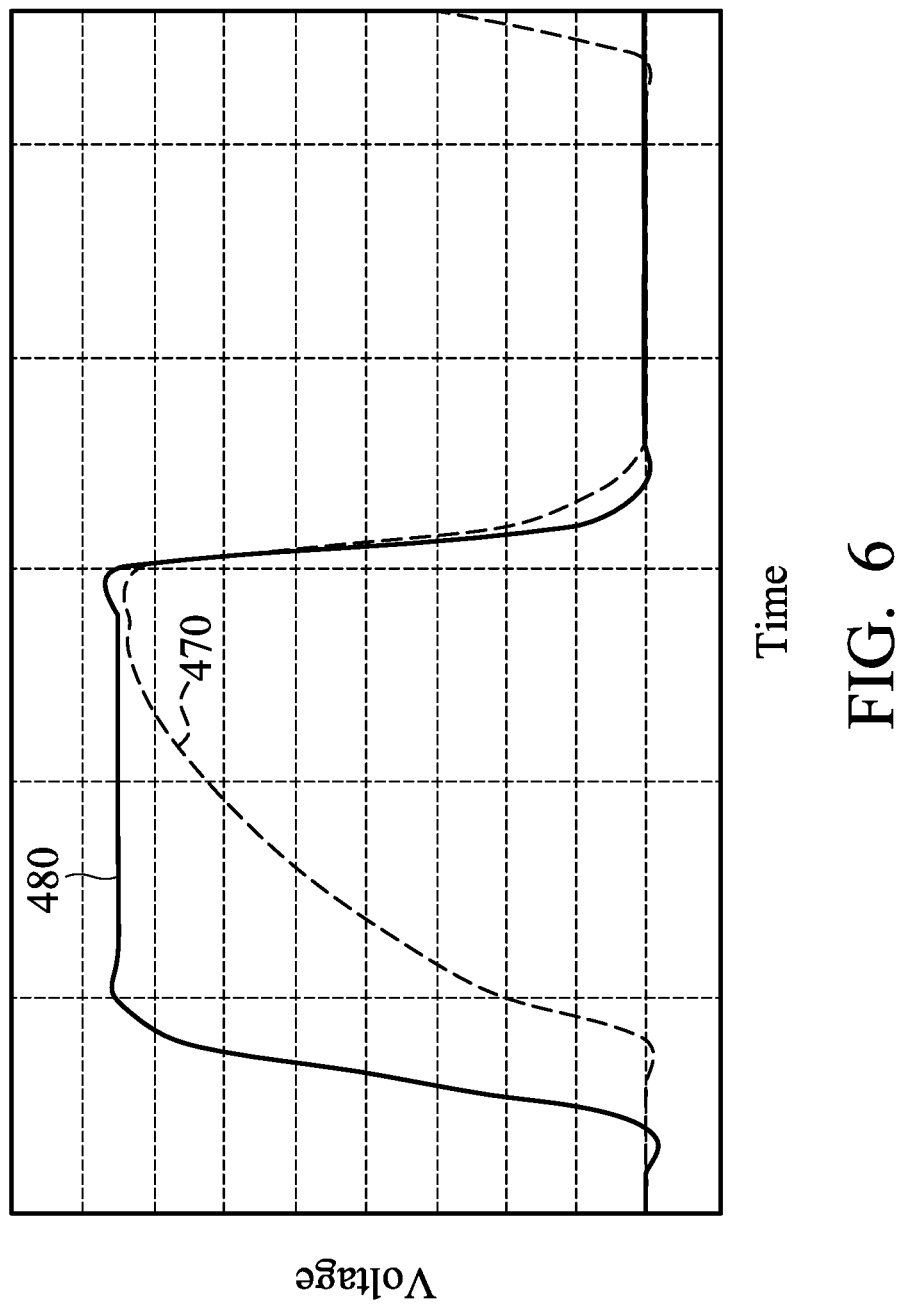
FIG. 6 is a voltage versus time (V-T) diagram showing a comparison of the driving abilities of the output buffer in some embodiments and a conventional output buffer.

FIG. 6 is a voltage versus time (V-T) diagram showing the comparison of the driving abilities between the output buffer in some embodiments and the conventional output buffer.

In FIG. 6, a line 470 illustrates a voltage-time (V-T) curve of the conventional output buffer. In addition, a line 480 illustrates a voltage-time (V-T) curve of the output buffer in some embodiments. Because the enhancement-mode MOS is usually used as the transistor device of the conventional output buffer, the driving ability and the efficiency (the switching frequency) of the conventional output buffer is effected (suffered) by the on-resistance (Ron), the gate charge (Qg), the gate-to-drain charge (Qgd) or the gate-to-source charge (Qgs) of the device and hard to be effectively improved. In some embodiments, the transistor device (the switch) of the output buffer in some embodiments uses one of native transistor device, a depletion-mode transistor device and a low-threshold transistor device. The threshold voltage (Vt) of the transistor device may be adjusted close to 0V (e.g. equal to or less than about 0.5V), or may be adjusted equal to or less than about 0V. Compared to the conventional output buffer (the line 470), the transistor device (the switch) of the output buffer in some embodiments (the line 480), which uses one of native transistor device, a depletion-mode transistor device and a low-threshold transistor device, can increase the operation frequency (switching speed) of the device and achieve the required analog voltage level for the pixels 112 in a shorter time. In addition, the image display quality and the response time of the display system can be further improved.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming an output buffer of a source driver, comprising:
   providing a P-type substrate;
   forming a P-type well doped region in the P-type substrate;
   forming a first N-type well doped region and a second N-type well doped region, wherein the first and second N-type well doped regions are on opposite sides of the P-type well doped region;
   forming a first isolation feature in the first N-type well doped region;

forming a second isolation feature in the second N-type well doped region;

forming a gate structure on the P-type substrate, wherein the gate structure entirely covers the P-type well doped region, the first isolation feature, and the second isolation feature, and covers a portion of the first and second N-type well doped regions;

performing a first threshold voltage adjusting implantation process on a portion of the P-type well doped region; and performing a second device threshold voltage adjusting implantation process on the portion of the P-type well doped region, so that the threshold voltage (Vt) of the output buffer is adjusted equal to or less than 0.5 volts (V).

2. The method for forming an output buffer of a source driver as claimed in claim 1, wherein dopants implanted by the first device threshold voltage adjusting implantation process have the same conductive type as dopants implanted by the second device threshold voltage adjusting implantation process.

3. The method for forming an output buffer of a source driver as claimed in claim 1, wherein dopants implanted by the first device threshold voltage adjusting implantation process have opposite conductive types to dopants implanted by the second device threshold voltage adjusting implantation process.

4. The method for forming an output buffer of a source driver as claimed in claim 1, wherein the second device threshold voltage adjusting implantation process is performed through a mask, wherein the mask has an opening to expose the portion of the P-type well doped region only.

5. The method for forming an output buffer of a source driver as claimed in claim 1, further comprising:

forming a first N-type heavily doped region on the first N-type well doped region after performing the first device threshold voltage adjusting implantation process and the second device threshold voltage adjusting implantation process; and forming a second N-type heavily doped region on the second N-type well doped region after performing the first device threshold voltage adjusting implantation process and the second device threshold voltage adjusting implantation process.

6. The method for forming an output buffer of a source driver as claimed in claim 1, wherein the first isolation feature is disposed between the first N-type heavily doped region and the P-type well doped region, and the second isolation feature is disposed between the second N-type heavily doped region and the P-type well doped region.

7. The method for forming an output buffer of a source driver as claimed in claim 1, further comprising:

performing the first device threshold voltage adjusting implantation process on the first isolation feature and the second isolation feature; and performing the second device threshold voltage adjusting implantation process on the first isolation feature and the second isolation feature.

* * * * *